United States Patent [19]

Ganguly et al.

[11] Patent Number: 5,811,841
[45] Date of Patent: Sep. 22, 1998

[54] PHOTOCONDUCTIVE SWITCHING WITH THIN LAYER ENHANCED BREAKDOWN CHARATERISTICS

[75] Inventors: Biswa N. Ganguly, Beavercreek, Ohio; Brian A. Hibbeln, Trevor, Wis.

[73] Assignee: The United States of America as represented by the Secretary of the Air Force, Washington, D.C.

[21] Appl. No.: 832,250

[22] Filed: Apr. 3, 1997

[51] Int. Cl.⁶ .................................................. H01L 29/74
[52] U.S. Cl. .......................... 257/113; 257/431; 257/459
[58] Field of Search ................................ 257/113, 431, 257/451, 457, 459

[56] References Cited

U.S. PATENT DOCUMENTS

| | | | |
|---|---|---|---|
| 3,577,046 | 5/1971 | Moyson | 317/235 R |
| 3,758,797 | 9/1973 | Peterson et al. | 307/324 |
| 3,893,153 | 7/1975 | Page et al. | 357/38 |
| 3,917,943 | 11/1975 | Auston | 250/211 |
| 4,127,784 | 11/1978 | Proud, Jr. et al. | 307/311 |
| 4,219,833 | 8/1980 | Temple | 357/38 |
| 4,376,285 | 3/1983 | Leonburger et al. | 357/17 |
| 4,412,242 | 10/1983 | Herman et al. | 357/52 |
| 4,449,140 | 5/1984 | Board | 357/7 |
| 4,673,864 | 6/1987 | Dessens et al. | 323/221 |
| 4,899,204 | 2/1990 | Rosen et al. | 357/30 |

OTHER PUBLICATIONS

Peterkin, F.E. and Williams, P.F. *Inhibition of surface-related electrical breakdown of long P+-1-n+ silicon structures.* Appl. Phys. Lett 62(18), May 1993, pp. 2236-2238.

*Primary Examiner*—Minh-Loan Tran
*Attorney, Agent, or Firm*—Gerald B. Hollins; Thomas L. Kundert

[57] ABSTRACT

A high voltage high current semiconductor switching device in which the tendency to incur premature electrical breakdown through carrier channels formed slightly below the surface of the semiconductor material is avoided. This avoidance occurs through use of a current dispersing electrically insulating element added at one extremity of the switching device structure. The added current dispersing element may be in the form of a thin oxide layer added at the anode end of the device in the case of a silicon embodiment of the invention. Tunneling conduction is believed to occur in this silicon dioxide layer and such conduction has the effect of dispersing the current through the silicon over a cross-sectional area sufficiently large to prevent the current filamentation, localized heating, thermal runaway and self destruction sequence often encountered in previous arrangements of higher energy semiconductor switches. Although several semiconductor materials are believed feasible for fabricating the device, a silicon material embodiment is primarily disclosed.

19 Claims, 8 Drawing Sheets

PHOTOCONDUCTIVE SWITCHING WITH THIN LAYER ENHANCED BREAKDOWN CHARATERISTICS

RIGHTS OF THE GOVERNMENT

The invention described herein may be manufactured and used by or for the Government of the United States for all governmental purposes without the payment of any royalty.

BACKGROUND OF THE INVENTION

This invention relates to the field of solid state optoelectronic switching of higher voltage and higher current electrical energy.

For many applications such as lasers and radar drive circuits there exists a need for fast, pulsed, high voltage, and relatively high current electrical switches. Presently, gaseous discharge switches such as thyratrons, krytrons, ignitrons, and spark gaps are used in these applications. These types of switching devices however exhibit many undesirable characteristics such as poor reliability, low current densities, and short lifetimes. It would therefore be advantageous to replace these switches with a solid state photoconductive semiconductor switch. A photoconductive semiconductor switch is typically made from a high resistivity (intrinsic) semiconductor material, such as silicon, gallium arsenide or silicon carbide; a semiconductor material whose conductivity increases by four or five orders of magnitude with suitable optical illumination. Silicon photoconductive semiconductor switches can be used to switch large energy pulses of short duration and precise timing. These attributes combined with high voltage and current ratings and long life expectancy, make a silicon photoconductive semiconductor switch, for example, an excellent candidate to replace current gaseous discharge switches.

At this time, a limiting factor in the operation of photoconductive semiconductor switch is the occurrence of a premature breakdown event at or slightly below the surface of the semiconductor material. This problem has, in fact hampered the development of high voltage semiconductor switching devices for the last 30 years. These breakdown phenomena can destroy the semiconductor or create a permanent, highly conductive path between the switch electrodes. A regenerative or vicious circle sequence in which increasing temperature results in more current flow which results in additional increased temperature and so on is particularly difficult to control in many switch uses, once this breakdown occurs.

Although the bulk breakdown of silicon is quite high (200 kilovolts/cm), flashover at the surface can occur with lower fields, fields on the order of only 20 kilovolts/cm. Until recently, the flashover phenomena in semiconductors was modeled as an insulator breakdown. Insulators have a high secondary electron emission coefficient which leads to a breakdown on the surface of the insulator. Recent work has shown that this is clearly not the case with silicon. Although many of the physical mechanisms of this flashover are not completely understood, a variety of attempts have been made to limit its occurrence in photoconductive semiconductor switch devices.

In the early development of high-voltage (>100 Volts) bipolar diodes and transistors, for example, it was found that surface breakdown occurred quicker than the bulk avalanche multiplication inside the semiconductor. This early problem was overcome by simply beveling the edges of the semiconductor device. This technique decreased the sharp edges of the device and thus decreased the electric field in this region. By using very acute beveled edges, these early low power devices were then limited by bulk avalanche breakdown. Today's semiconductor switching devices must, however, be capable of controlling tens of kilovolts; under these conditions simply beveling the device edges is not sufficient. The present invention is therefore believed to represent one of the more successful non-beveled edge efforts to limit the occurrence of both surface breakdown and current concentration-induced thermal breakdown in switching devices.

The U.S. Patent art discloses the existence of several types of semiconductor devices having one or more attributes relating somewhat to the present invention switching device; these patent-disclosed devices are believed to be of at least general background interest with respect to the present invention and, therefore, patents representative of these devices are identified at this point.

Multiple semiconductor layered switching devices capable of high voltage and high current switching events, i.e., thyristor or regenerative switching devices, are disclosed in a number of patents, including the U.S. Pat. No. 3,577,046 of J. Moyson and the U.S. Pat. No. 3,893,153 of D. J. Page et al.; the latter of these patents moreover involves a light activated thyristor device. The simple structure and the operating concepts of the present invention switching device are, however, believed distinguished over those disclosed in these two and similar patents.

In a similar manner the combination of a high voltage semiconductor device and a glassy layer are disclosed in the U.S. Pat. No. 4,412,242 of T. Herman et al., and in the form of a P-N junction-inclusive barrier switching device in the U.S. Pat. No. 4,449,140 of K. Board. The latter Board patent also notes the use of a silicon dioxide film or a film of semi-insulating material in a switching device as used in the present invention. The function and the dimensions relating to the insulating film layer used in the present invention are however, believed distinguishing over the disclosure of these patents.

Optoelectronic switching devices which employ the bulk properties of semi-insulating substrates are disclosed in the U.S. Pat. Nos. 3,917,943 of Auston; 4,127,784 of Proud Jr. et al.; and 4,376,285 of Leonburger et al. These patents are also identified in the somewhat related U.S. Pat. No. 4,899,204 of H. Rosen, which additionally involves high voltage switching and which in further addition discusses the vicious circle events involved in a thermal runaway sequence in a switching device. The avoidance of such a thermal runaway sequence is, in fact, a significant aspect of the present invention where runaway is avoided at least in part by a cross sectional area dispersion of switch current flow. The function and dimensions relating to an insulating film layer used in the present invention are, however, believed distinguishing over the disclosure of these patents.

Another class of switching devices which may be of general background interest with respect to the present invention is identified as the Ovshinsky semiconductor glass switch, a device which is based on amorphous semiconductor material rather than the high purity single crystal materials of the present invention—and most current day semiconductor devices. A number of U.S. Patents have issued to Mr. Ovshinsky and his colleagues in a commercial venture named "Energy Conversion Devices Incorporated" (or a similar name). The present invention is believed distinguished over the Ovshinsky devices by its conventional semiconductor material structure and by the added thin film of current dispersing material.

Another aspect relating to optoelectronic switching devices is described by authors F. E. Peterkin and P. F. Williams et al., in the paper "Inhibition of Surface Flashover on Silicon Due to Weak Visible or Infrared Illumination," published in the Journal Appl. Phys. Lett (January 1992). Authors Peterkin and Williams found that by illuminating a small region of a sample near the semiconductor switch cathode with a 100 microjoule laser pulse of 532 nanometers wavelength, they were able to completely inhibit the flashover of a 30 kilovolt, 250 nanosecond pulse over a 10 mm region. They also suggest the inhibiting of flashover might be duplicated with p type doping of a small region near the device cathode. It was hoped that this doped region would provide recombination centers for the "hottest" electrons and help to distribute the current in the semiconductor. The use of doping and laser illumination of the semiconductor material in the Peterkin and Williams procedure is, however, believed distinguished from the concepts of the present invention.

SUMMARY OF THE INVENTION

The present invention provides a semiconductor high voltage high current electrical switching device which avoids a tendency toward current concentrations along a limited number of paths through the semiconductor material and the resulting tendency toward thermal runaway and device failure. The addition of a thin layer of current dispersing, and believed to be space charge or tunneling-action insulating material, to opposed electrode surfaces of the semiconductor material is used to achieve this current concentration avoidance.

It is an object of the present invention, therefore, to provide a semiconductor switching device of enhanced electrical breakdown characteristics.

It is another object of the invention to provide a semiconductor switching device wherein a tendency to incur electrical breakdown by way of channels formed slightly below the surface of the semiconductor device is improved upon.

It is another object of the invention to provide a semiconductor switching device wherein this tendency to incur electrical breakdown by way of channels formed slightly below the surface of the semiconductor device is improved upon through the addition of a layer to the device.

It is another object of the invention to provide a semiconductor switching device wherein a tendency to incur electrical breakdown by way of channels formed slightly below the surface of the semiconductor device is improved upon through the addition of a thin current dispersing layer to the device.

It is another object of the invention to provide a semiconductor switching device wherein the tendency to incur electrical breakdown by way of channels formed slightly below the surface of the semiconductor device is avoided through the addition of a thin current dispersing film at a single electrode such as the anode of the device.

It is another object of the invention to provide a semiconductor switching device wherein this tendency to incur electrical breakdown by way of channels formed below the surface of the semiconductor device is improved upon through addition of an oxide layer adjacent the anode electrode of the switching device.

It is another object of the invention to provide a semiconductor switching device wherein current dispersion across the cross sectional area of the device is achieved by way of the quantum tunneling mechanism.

It is another object of the invention to provide a semiconductor switching device wherein current dispersion across the cross sectional area of the device is achieved by way of the space charge current limiting mechanism.

Additional objects and features of the invention will be understood from the following description and claims and the accompanying drawings.

These and other objects of the invention are achieved by a high voltage high current semiconductor optoelectronic switching device of enhanced electrical breakdown characteristic which comprises:

an elongated mass of semiconductor material;

a cathode electrode disposed on said mass of semiconductor material at one physical extremity thereof;

an anode electrode disposed on said mass of semiconductor material at an opposite physical extremity thereof;

a thin layer of electrical charge carrier dispersing electrically insulating material located at one physical extremity of said elongated mass of semiconductor material intermediate said semiconductor material and one of said electrodes; and an interruptable source of charge carrier flow-initiating radiant energy disposed in communication with said elongated mass of semiconductor material.

DETAILED DESCRIPTION

Figure 1:
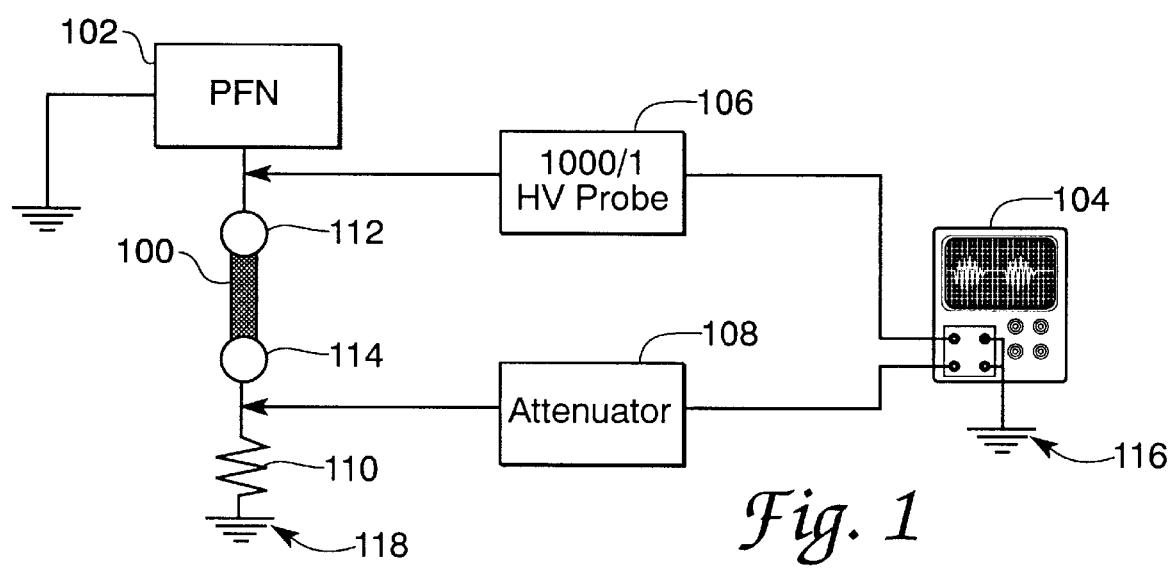
FIG. 1 shows a use circuit for a semiconductor switch according to the invention, a circuit also suitable for semiconductor switch characteristic measurement.

FIG. 1 in the drawings shows a semiconductor switch element 100 according to the invention connected into an electrical circuit representative of circuits which may use such switches in functional apparatus. In the FIG. 1 drawing the switch element 100 is transiently energized by a trigger-responsive pulse forming network 102 which provides energy pulses of a selected brief duration and peak voltage rating in the tens of kilovolts range. Additional circuit elements may be used when the switch element 100 is coupled to the laser or radar typical load having need of higher voltage and high current switches of this type. In a functional apparatus using such switches, for example the pulse forming network 102 may be provided with an additional output terminal and arranged with an internal circuit configuration such that a node grounding accomplished by the switch element 100 is effective to produce a transient high voltage output pulse at this additional output terminal, a transient pulse for load energization use.

For characteristics measurement of the switch element 100 a laboratory apparatus-embodied pulse forming network 102 capable of delivering 100 to 200 nanoseconds pulses ranging from 3 to 18 kilovolts in magnitude may be used. This pulse forming network may be initially triggered by, for example, a 2 volt pulse from a pulse generator. This 2 volt pulse may then trigger a field-effect transistor biased at about 100 volts with a DC power supply. The resulting 100 volt pulse may then trigger a 5 kilovolt pulse from a high voltage pulse generator. Finally, the 5 kilovolt pulse may trigger a variable output 20 kilovolt DC supply which discharges across a thyratron to deliver the voltage pulse to the switch element 100. These 18 kilovolt and, for example, 100 to 200 nanoseconds parameters and a current amplitude limitation of 20 amperes are selected for the sample measurements discussed herein in order to preclude damage to the sample switch device under test at 100 in FIG. 1. As will be apparent in the graphic data herein, these limitations are actually attained in the achieved sample switch measurements and therefore indicate the presence of incurred measurement limitations. This condition, however, is deemed preferable however to testing at greater energy levels where sample damage and sample replacement and therefore sample to sample correlation difficulties may be incurred.

The FIG. 1 diagram also shows several additional laboratory equipment elements which may be used in order to observe electrical characteristics of the switch element 100. These additional laboratory equipment elements include an oscilloscope 104, a voltage divider probe 106 for viewing and measuring high voltage pulses and a current sensing resistor 110, a resistor which may be of some low electrical resistance such as fifty ohms, ten ohms, one ohm, one tenth ohm or one one hundredth ohm and so-on depending on factors such as the currents being measured and the sensitivity of the oscilloscope employed at 104. With larger values of this resistor, an attenuator or voltage divider probe 108 for reducing electrical signals generated across the resistor 110 to the range of the oscilloscope 104 may be needed. The oscilloscope 104 may be of several different types such as a dual channel or dual beam type manufactured by Hewlett Packard Incorporated or Tektronix Incorporated; a bandwidth characteristic extending well into the hundreds of megahertz range is preferable in order to observe certain waveforms characteristic of materials used in the invention apparatus as is explained later herein. The voltage and current waveforms of interest may, for example, be digitized with a 125 MHz bandwidth digital oscilloscope at a 100M samples/sec digitizing rate. The collected data may then be transferred to a laboratory computer and stored on disk if desired.

It should be noted that measurements of the voltage signals shown in FIG. 1 are made with respect to a common ground point in both the voltage from the pulse forming network 102, i.e., the voltage across the switch under test, and the voltage across the resistor 110 instances; this ground measurement reference point is indicated at 116 and 118 in the FIG. 1 drawing. In computing the actual voltage appearing across a tested switching device at 100, it is therefore necessary to subtract the sometimes considerable voltage which may appear across the resistor 110 to ascertain actual switching device voltages and characteristics.

The switch element 100 in FIG. 1 may be maintained in a high vacuum system, at a pressure of $2 \times 10^{-8}$ Torr, for example, especially for accomplishing laboratory characteristic measurements with the oscilloscope 104 and its associated apparatus. High vacuum mounting of the sample 100 is desirable for characterization purposes in order to assure the absence of sample contamination from the atmosphere and other sources. The attending pressure in the FIG. 1 vacuum testing arrangement may be monitored using a standard ion gauge and chart recorder. For the FIG. 1 laboratory characteristic measurements the switch element 100 may be mounted in the vacuum chamber by two spherical aluminum electrodes 112 and 114 of about one inch or 2.54 cm diameter. Each spherical aluminum electrode may be provided with an on-axis recess of 1.1 cm diameter and 0.2 cm depth that is filled with indium metal to make good electrical contact with the silicon or other semiconductor of the switch element 100. Neither such enclosure in a high vacuum environment nor such elaborate indium and ball contacts are required for operational use of switching devices according to the invention, however.

Two different silicon samples for the switch element 100 of FIG. 1 are discussed herein. Each of these samples is configured in cylindrical form and has a 10 millimeter diameter and 5 millimeter height and may be comprised of high purity silicon, silicon of typical resistivity of 30K ohm-cm. The first sample, as is characterized electrically in FIG. 2 and FIG. 3 for example, is a pure silicon sample with both ends coated with two microns of gold for electrical connection purposes. The second sample, as is characterized electrically in FIG. 4 and FIG. 6 for example, is also comprised of high purity silicon, silicon of resistivity 30K ohm-cm, and has one end coated with a 2.5 micron layer of $SiO_2$, an oxide layer grown by heat treating the sample at 900° C. for 8 hours in an oxygen atmosphere. This end is then covered with 1000 Angstroms of aluminum. The opposite end of the sample is coated with 2000 nanometers of gold.

Figure 9A:
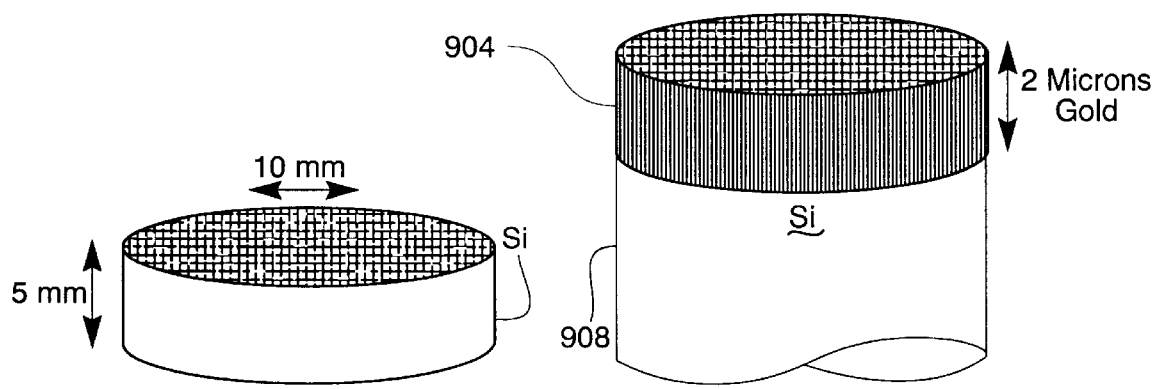
FIG. 9a shows a physical representation of a semiconductor switch according to the invention.
Figure 9B:
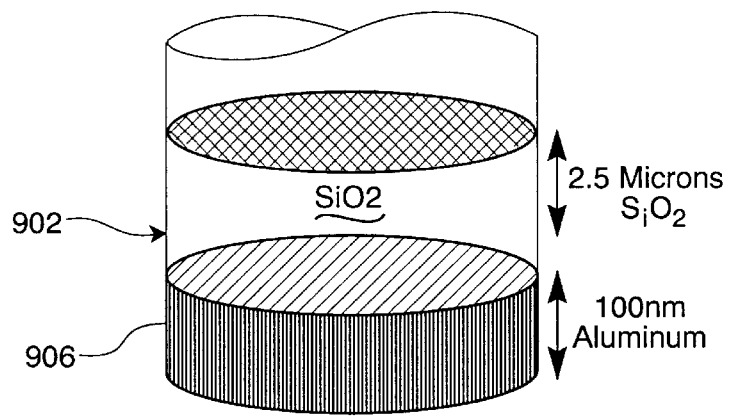
FIG. 9b shows enlarged details of the FIG. 9a switch.

FIG. 9a in the drawings shows an actual shape arrangement of this second sample switch element for use at 100 in FIG. 1. FIG. 9b shows an expanded and central section-omitted view of the FIG. 9a sample in which the three layers 902, 904, and 906, as well as the semiconductor mass 908 according to the invention are made visible. The FIG. 9a and FIG. 9b drawings also represent a preferred physical arrangement, of the present invention switch. Notwithstanding this preferred physical arrangement, however, it is contemplated that the invention may also employ semiconductor material shapes other than the FIG. 9a and FIG. 9b illustrated cylindrical shape, shapes of rectangular or other corner angle cross-sectional configuration and shapes of axially changing cross-sectional shape and area are, for example, considered viable for the invention.

Figure 2:
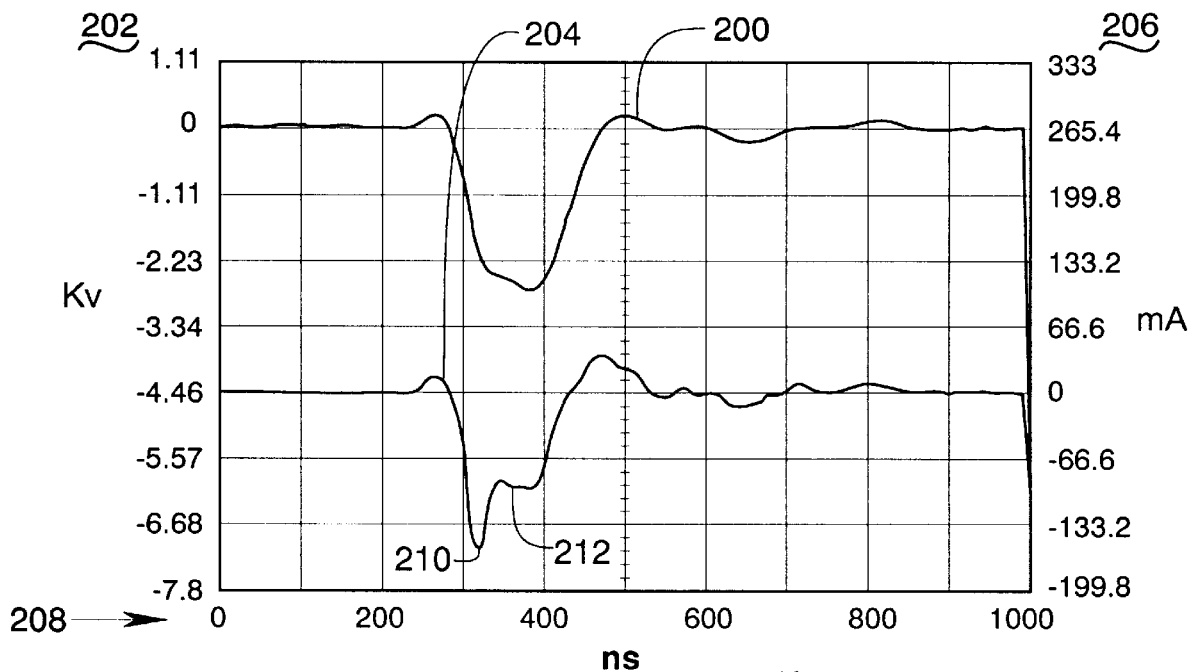
FIG. 2 shows time-related conduction current and voltage waveforms for a silicon semiconductor material switch according to the invention.

FIG. 2 in the drawings shows the type of waveform measurements achievable with the FIG. 1 circuit and the oscilloscope 104. In this FIG. 2 drawing there is shown an uppermost voltage waveform 200 and a current waveform 204, waveforms which are plotted against the vertical voltage scale 202 and the vertical current or milliamps scale 206, respectively. The voltage waveform 200 and current waveform 204 represent waveshapes which are characteristics of a conduction event in the semiconductor material silicon, these characteristics being measured with respect to the horizontal time scale 208 in FIG. 2. Current and voltage magnitudes in the FIG. 2 drawing are determined largely by the internal impedance and other characteristic of the pulse forming network 102 and, of course, by characteristics of the switch element 100. An internal impedance near two hundred eighty ohms has been satisfactory for the pulse forming network 102.

In FIG. 2, the voltage pulse 200 peaks at a value of negative 2.8 kilovolt and has a duration of almost 200 nanoseconds. The first peak 210 in the current pulse 204 is the displacement current, which can be attributed to the capacitance of the junction. The second peak at 212, which is the conduction current, coincides with the voltage peak and has an amplitude of 98 milliamps. It is also relevant to note the rise time and duration of the current pulse. In this figure the current rise time is about 50 nanoseconds and the FWHM (Full Width at Half Maximum) current duration is about 100 nanoseconds. Currents with these characteristics are usually bulk conduction currents in which the current is distributed across the semiconductor sample.

Figure 3:
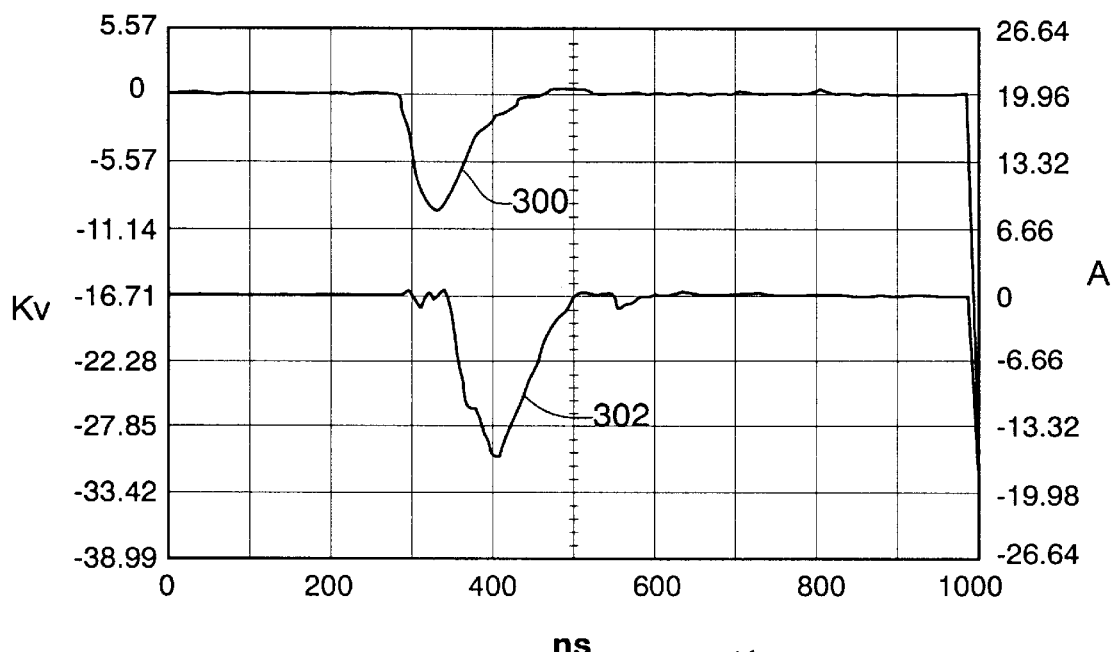
FIG. 3 shows time-related breakdown current and voltage waveforms for silicon semiconductor material.

FIG. 3 in the drawings shows typical breakdown current and voltage waveforms for a pure silicon sample used in the switch element 100 of FIG. 1. The FIG. 3 curves represent characteristics which are improved-upon by the present invention and are shown at this point for comparison purposes. In FIG. 3, the again uppermost voltage pulse 300 peaks at negative 8 kilovolts and has a duration of 100 nanoseconds. The voltage waveform is also slightly clamped or limited towards the end of the pulse 300 due to the elsewhere herein described limitations of the employed power supply. The peak of the current pulse 302 is delayed by 60 nanoseconds and has a peak of 16.5 amperes in FIG. 3. This delay time is considered to be associated with build up of the local electric field at the interface before breakdown actually occurs. This local electric field will generally tend to increase as more electrons are injected into the sample. It may also decrease for a short period of time as recombination and diffusion take place. The rise time of the current pulse is also faster (35 nanoseconds) and the width is smaller (75 nanoseconds FWHM) in FIG. 3 as compared with the conduction current shown in FIG. 2. The FIG. 3 current is characteristic of the avalanche process in which electron multiplication occurs, which causes large currents to develop and flow very quickly down channels formed in the silicon. This breakdown mechanism is addressed by the present invention in which a notable improvement in the FIG. 3 characteristics of a switch element 100 is achieved.

Figure 4:
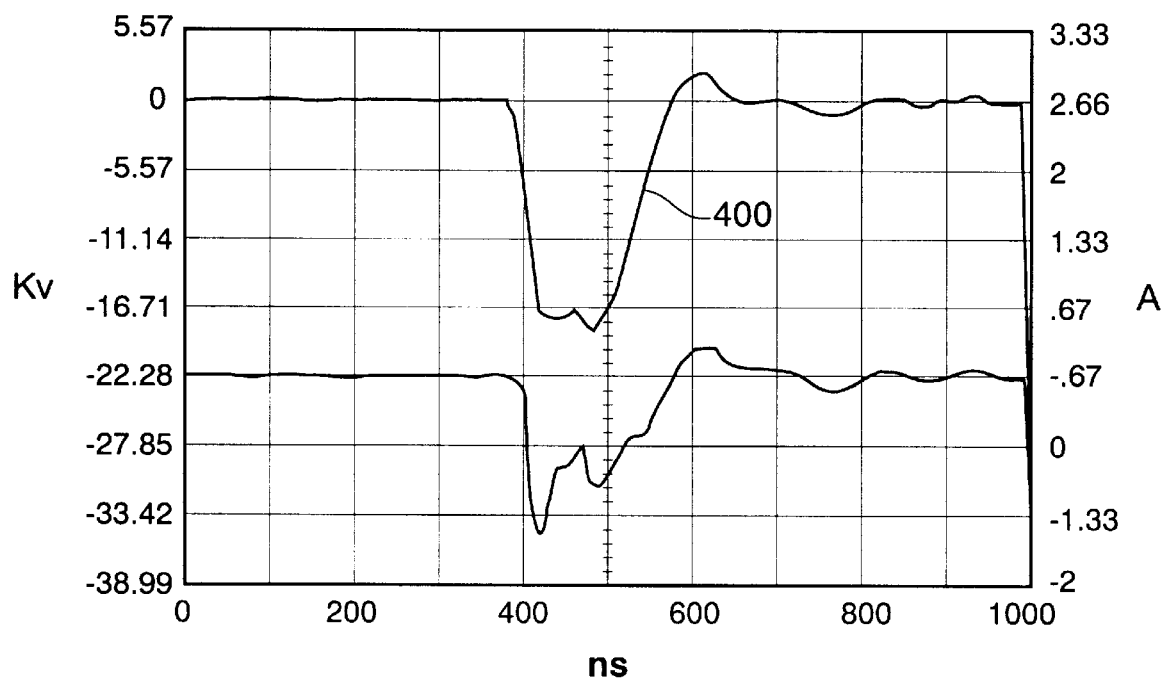
FIG. 4 shows time-related conduction current and voltage waveforms for oxide coated silicon semiconductor material.

FIG. 4 of the drawings shows conduction current and voltage waveforms for an oxide coated sample of silicon used in the switch element 100 of FIG. 1. At about 17 kilovolts of applied voltage, the current waveform 400 exhibits bulk conduction current behavior similar to the conduction shown in FIG. 2 for a pure silicon sample impressed with a much lower applied voltage. Note that such current conduction behavior is typical of space-charge limited conduction behavior of a semiconductor material.

Figure 5:
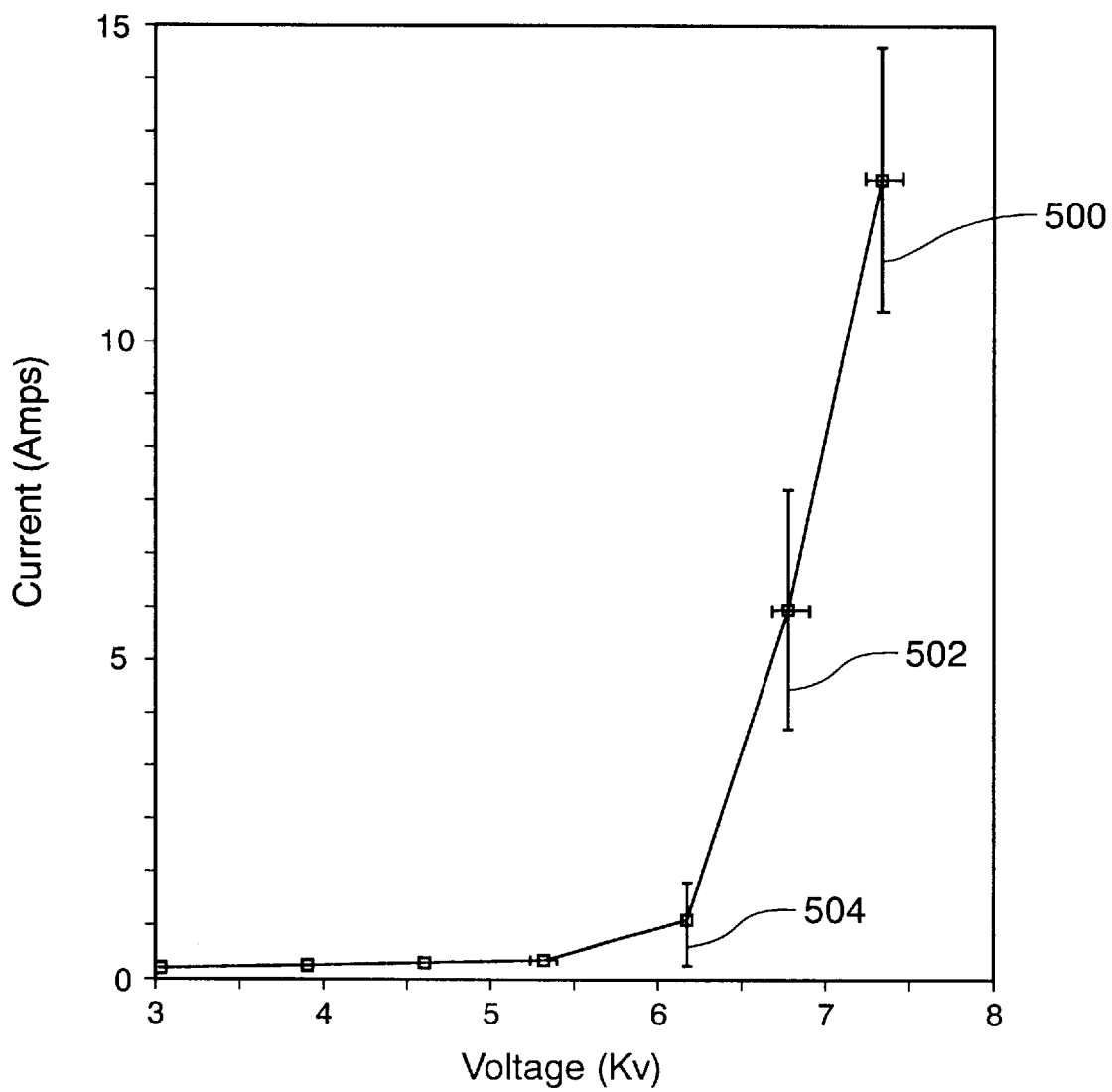
FIG. 5 shows a conduction current versus voltage waveform for silicon semiconductor material.
Figure 6:
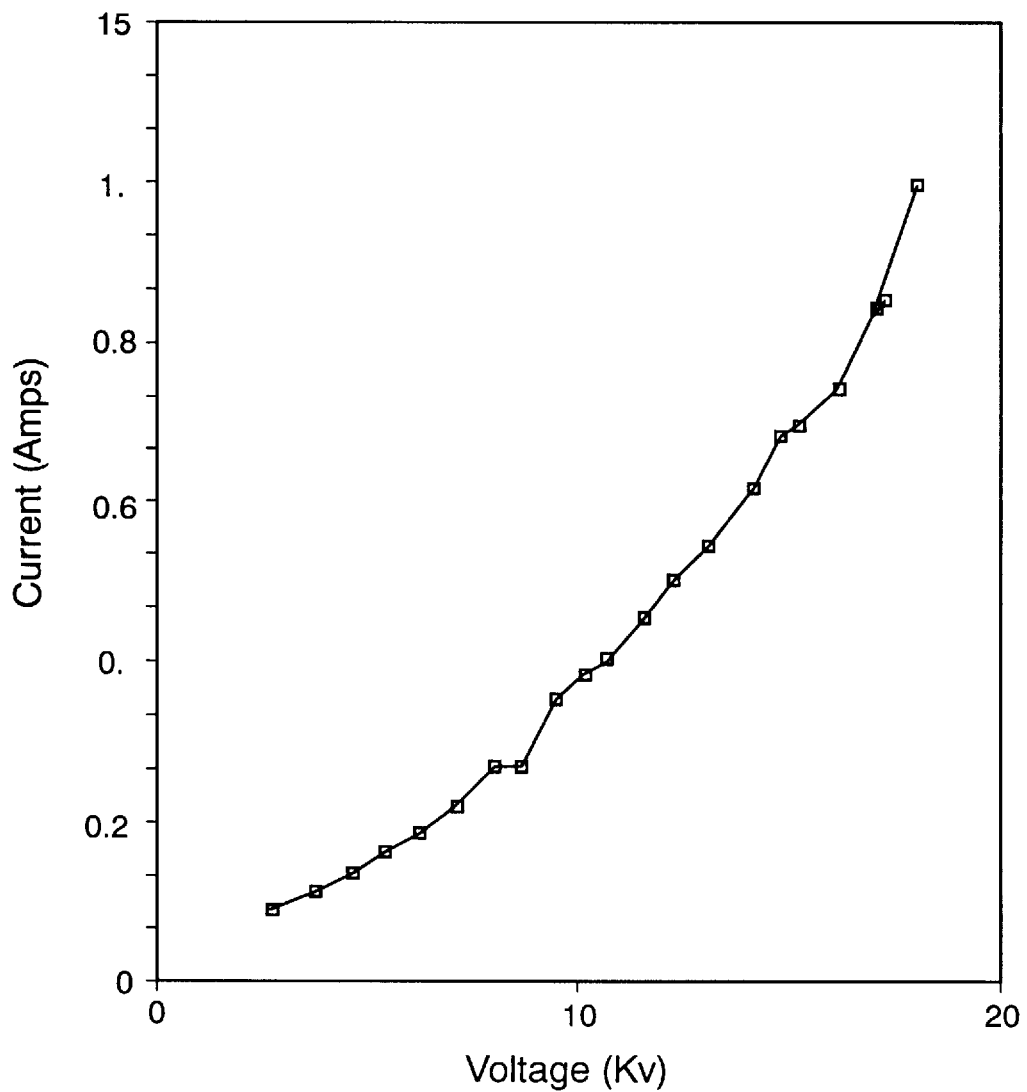
FIG. 6 shows a FIG. 5 type conduction current versus voltage waveform for oxide coated silicon semiconductor material.

FIG. 5 and FIG. 6 of the drawings show a comparison of voltage breakdown characteristics for the two silicon samples considered herein when the sample is used for the switch element 100 in FIG. 1, i.e., the breakdown results for silicon and oxide coated silicon, respectively. As shown in FIG. 5 the "unconditioned" silicon sample breaks down with an applied voltage of about 8 kilovolts, whereas the FIG. 6 silicon sample with the two micron oxide barrier located at the anode, i.e., the sample according to the present invention, does not exhibit breakdown conduction up to the 18 kilovolts limit of the employed high voltage power supply. The FIG. 5 and FIG. 6 data therefore demonstrates that the dielectric breakdown threshold of a high power silicon photoconductive switch can be improved by at least a factor of two with the use of an oxide barrier according to the invention at the switch anode. The FIG. 5 drawing of this pair also shows by way of the vertically extending bars at 500, 502, and 504 at the final three data points, the range of statistical fluctuation to be expected in a measurement of breakdown voltages in a silicon sample. In the case of the present invention this FIG. 5 statistical fluctuation has the significance of demonstrating the complete randomness of the breakdown process near the breakdown threshold applied voltage.

The present invention oxide barrier layer, which is shown at 902 in FIG. 9*b*, is understood to result in a space-charge limited conduction mechanism in the body 904 of the film layer. It is moreover conduction of this nature which prevents formation of current filaments by the hole injection process, as is otherwise observed in silicon, and gallium arsenide and other semiconductor materials. This conduction in the layer 902 may also be characterized as a quantum tunneling action. This limited conduction by whatever mechanism in the added film layer functions to lower the filament path current flows and thereby to also control the operating temperature of the switching device and prevent the thermal runaway condition which can occur in its absence.

The layer 902 may actually be of a physical thickness between 200 and 3000 nanometers. Layers disposed in the lower portion of this range provide less current dispersing and current limiting ability and greater physical fragility, but also add lower amounts of electrical resistance to the switch's electrical circuit. Layers measuring in the upper portion of this range tend to desirably increase the OFF state resistance of the switch but also increase the ON state voltage drop of the switch. Clearly a trade-off condition arises between a desirable layer thickness and a desired low switch resistance in each different use or each different embodiment of the switching device. It is notable that in the FIG. 6 drawing the current-voltage behavior up to the level of 18 kilovolts shows a voltage squared dependence of current. This is a characteristic of space charge limited current conduction in semiconductors.

The current conduction involving hole injection process conduction or breakdown conduction, i.e., the conduction which is improved upon with use of the present invention, as shown by the FIG. 5 and FIG. 6 comparisons, has been described in the case of silicon semiconductor material by the authors F. E. Peterkin, P. F. Williams, T. Ridolfi, B. J. Hankla, and L. L. Buresh in an article appearing in the Digest of Technical Papers of the 8th Pulsed Power Conference, San Diego, Calif., 1991; and also in the case of gallium arsenide semiconductor material by authors K. H. Schoenbach, J. S. Kenney, A. Koenig, B. J. Ocampo, R. F. K. Germer, and H. J. Schulz in an article appearing in the same Digest of Technical Papers, of the 8th Pulsed Power Conference, San Diego, 1991. These published articles do not, of course, consider the presently disclosed remedy for this breakdown conduction.

Figure 7:
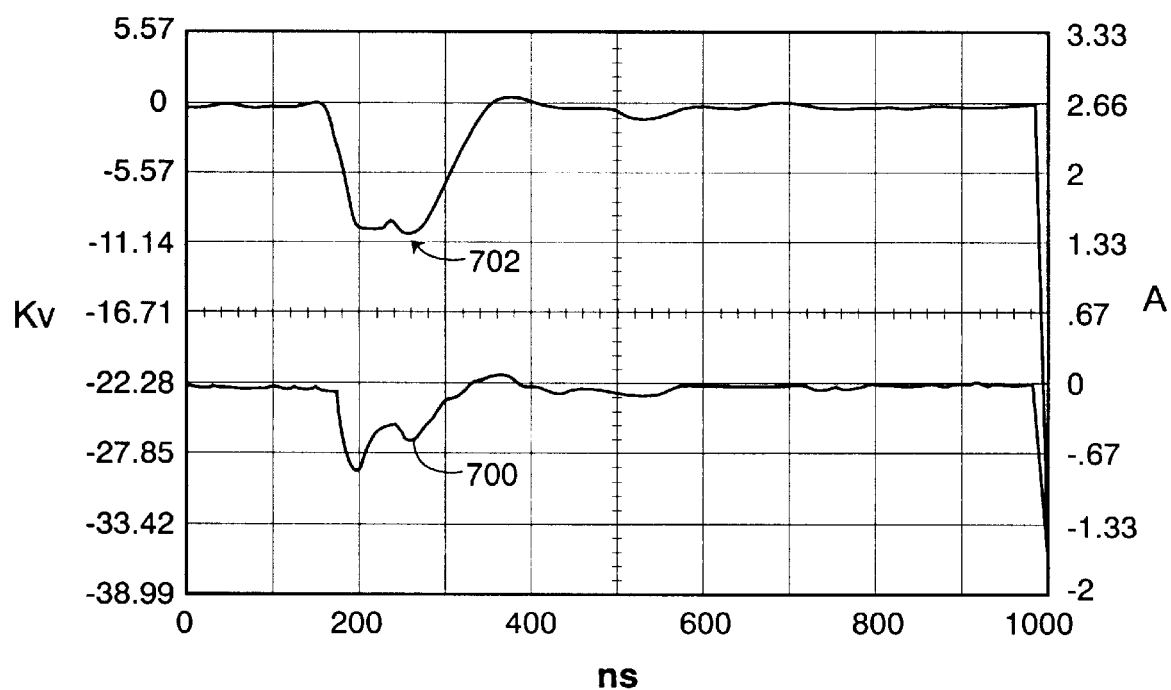
FIG. 7 shows time-related turned off current and voltage waveforms for a silicon semiconductor material switch according to the invention.
Figure 8:
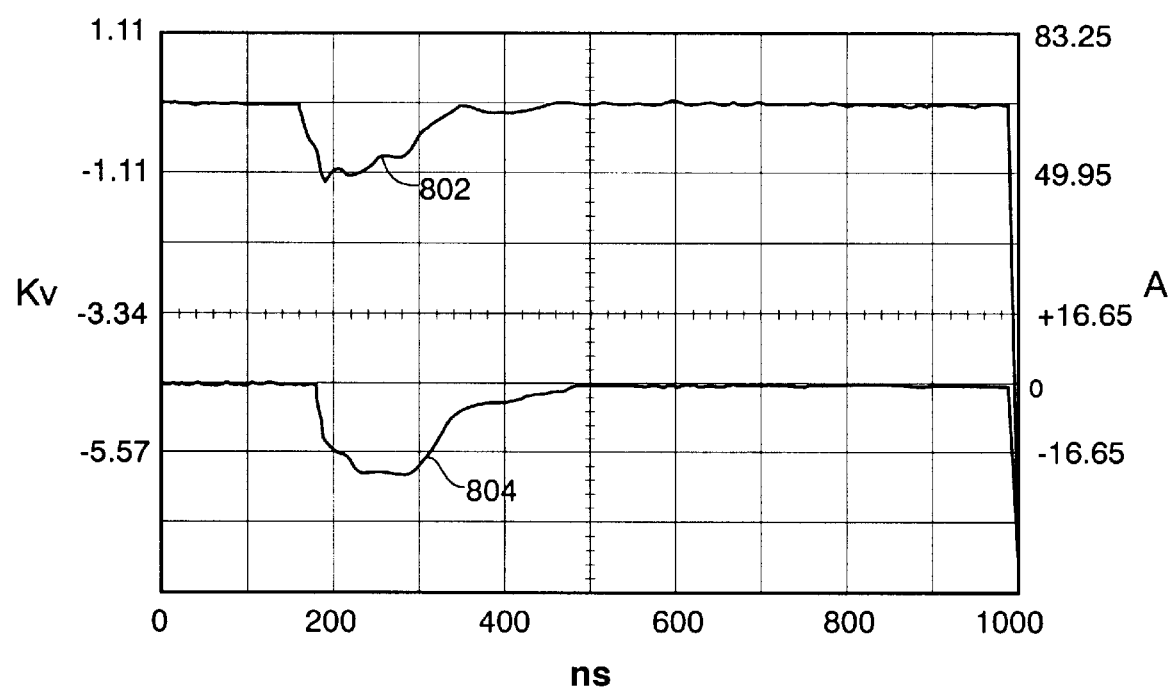
FIG. 8 shows time-related turned on current and voltage waveforms for a silicon semiconductor material switch according to the invention.

A figure of merit for the FIG. 1 photoconductive switch 100 may be defined in terms of the ratio of OFF and ON electrical impedance values for the switch 100 in FIG. 1. The temporal current-voltage waveforms shown in FIGS. 7 and 8 show data from which such a figure of merit for the disclosed silicon embodiment of the switch operating at about 10 kilovolts of applied voltage may be obtained. In FIG. 7, for example, the OFF state current at 700 is about 0.47A and the voltage hold off is 10.2 kilovolts, as shown at 702. Under these conditions the turned OFF switch provides an impedance of 10,200 volts/0.47 amperes or 21,700 ohms. In FIG. 8 the turned ON voltage, current and resistance values are (1200–1050) volts/21 amperes or 7.1 ohms (recalling that the relevant FIG. 1 voltages are measured to ground and therefore the 1050 volts across resistor 110 are to be excluded). A figure of merit for the FIG. 7 and FIG. 8 characterized switching device is therefore 21,700/7.1 or about 3,056, a value which reflects at least a three order of magnitude resistance change, a sufficient resistance change to be useful in a variety of higher voltage switching uses. The actually achieved FIG. 7 and FIG. 8 OFF to ON switch resistance ratio is probably somewhat better than this 3,056 indication since power supply limitations clearly influence the 21 amperes measurement and probably also the 10,200 volt measurement used in these computations.

For purposes of the above indicated figure of merit determination as well as for general use of the described switching device, the switch 100 may be turned ON by illumination with a 2 millijoule, 1.06 micron Nd:YAG laser pulse. Triggering energy of other wavelengths, for example wavelengths between one half and one micron, may also be employed; especially wavelengths below 1 micron range may be used. It should be mentioned that the indicated measurements of switch resistance are obtained with a laser pulse fired some two to three microseconds prior to the applied voltage pulse, a fact which demonstrates that the photo carrier recombination rate in the oxide coated silicon has not been altered with respect to that of pure silicon.

Alternate arrangements of the switch invention are also possible. These arrangements may include fabrication of the switch body portion from other wide bandgap materials, such as silicon carbide and gallium nitride for example. The use of materials other than an oxide of the employed semiconductor material for the electrode-adjacent film is also considered to be a viable alternative arrangement of the invention. In the case of a switch employing gallium arsenide semiconductor material, for example, a layer of aluminum nitride material or even silicon dioxide are believed preferable to use of an oxide of the semiconductor for the electrode-adjacent film. Replacement of the electrode-adjacent film with a doping modified layer of semiconductor material is also a possible arrangement of the invention. A boron doped layer may be used for this purpose in the case of a silicon switch element. The performance achieved with this arrangement of the invention is considered less desirable than that of the oxide layer film, however.

The high voltage high current switch of the present invention therefore demonstrates that the dielectric breakdown threshold of a representative semiconductor material, silicon, can be improved by a factor of two or more when an oxide coating of a few microns thickness is used between the anode electrode of the switch and the anode surface of the semiconductor material. This coating is understood to prevent injection of hole carriers at the anode, which could otherwise lead to the formation of current filamentation and a mechanism which eventually leads to avalanche breakdown in the semiconductor material.

While the apparatus and method herein described constitute a preferred embodiment of the invention, it is to be understood that the invention is not limited to this precise form of apparatus or method and that changes may be made therein without departing from the scope of the invention which is defined in the appended claims.

We claim:

1. A high voltage high current semiconductor optoelectronic switching device of enhanced electrical breakdown characteristics, said device comprising:
   an elongated mass of semiconductor material;
   a cathode electrode disposed on said mass of semiconductor material at one physical extremity thereof;
   an anode electrode disposed on said mass of semiconductor material at an opposite physical extremity thereof;
   a thin layer of electrical charge carrier dispersing electrically insulating material located at one physical extremity of said elongated mass of semiconductor material intermediate said semiconductor material and one of said electrodes; and
   a source of charge carrier flow-initiating radiant energy disposed in communication with said elongated mass of semiconductor material.

2. The high voltage high current semiconductor switching device of claim 1 wherein said thin layer of electrical charge carrier dispersing electrically insulating material is characterized by a space charge current limitation mechanism.

3. The high voltage high current semiconductor switching device of claim 2 wherein said thin layer of electrical charge carrier dispersing electrically insulating material is characterized by a tunneling conduction mechanism.

4. The high voltage high current semiconductor switching device of claim 1 wherein said thin layer of electrical charge carrier dispersing electrically insulating material is located intermediate said semiconductor material physical extremity and said anode electrode.

5. The high voltage high current semiconductor switching device of claim 4 wherein said elongated mass of semiconductor material is comprised of silicon and said thin layer of electrical charge carrier dispersing electrically insulating material is comprised of silicon dioxide.

6. The high voltage high current semiconductor switching device of claim 5 wherein said elongated mass of semiconductor material is comprised of high resistivity silicon material.

7. The high voltage high current semiconductor switching device of claim 5 wherein said elongated mass of semiconductor material is comprised of intrinsic silicon material.

8. The high voltage high current semiconductor switching device of claim 5 wherein said thin layer of electrical charge carrier dispersing electrically insulating material has a thickness between two hundred nanometers and three thousand nanometers.

9. The high voltage high current semiconductor switching device of claim 1 wherein said source of charge carrier flow-initiating radiant energy disposed in communication with said elongated mass of semiconductor material comprises a radiant energy source having a major spectral energy output of wavelength less than one micron.

10. The high voltage high current semiconductor switching device of claim 1 wherein said elongated mass of semiconductor material is comprised of gallium arsenide and said thin layer of electrical charge carrier dispersing electrically insulating material consists of one of the materials of gallium aluminum nitride and silicon dioxide.

11. The high voltage high current semiconductor switching device of claim 1 wherein said elongated mass of semiconductor material is comprised of silicon carbide.

12. A high voltage high current silicon semiconductor optoelectronic electrical switching device of cross sectional area-distributed current flow and resulting enhanced electrical breakdown characteristics, said device comprising:
   an elongated cylindrical-shaped mass of intrinsic silicon semiconductor material;
   a metallic aluminum cathode electrode disposed on said cylindrical-shaped mass of intrinsic silicon semiconductor material at a first endwise physical extremity thereof;

a metallic gold anode electrode disposed on said intrinsic silicon cylindrical-shaped mass of semiconductor material at an opposed second endwise physical extremity thereof;

a thin layer of electrical charge carrier dispersing silicon dioxide material located at said second endwise physical extremity of said cylindrical-shaped mass of intrinsic silicon semiconductor material intermediate said opposed second endwise physical extremity and said metallic gold anode electrode; and a laser source of charge carrier flow-initiating radiant energy of between one-half and one, micron wavelength disposed in communication with said elongated mass of semiconductor material.

13. The high voltage high current semiconductor electrical switching device of claim 12 wherein said thin layer of electrical charge carrier dispersing silicon dioxide material has a thickness of two and one half microns.

14. The high voltage high current semiconductor switching device of claim 13 wherein said metallic aluminum cathode electrode and said metallic gold anode electrode have thickness dimensions of one hundred nanometers and two microns, respectively.

15. The high voltage high current semiconductor switching device of claim 14 wherein said elongated cylindrical-shaped mass of intrinsic silicon semiconductor material has a diameter of ten millimeters and a length, between said first and second endwise physical extremities, of five millimeters and wherein said high voltage is a voltage of at least fifteen kilovolts.

16. The method of switching high voltage electrical energy comprising the steps of:

disposing a mass of semiconductor material between positive and negative polarity electrical nodes to be electively connected by said switching;

dispersing positive node to negative node electrical current flow in said mass of semiconductor material over a large cross sectional area portion of said mass by imposing a layer of current dispersing material characterized by one of the current flow mechanisms of tunneling and space charge limited conduction in the path of current flow through said semiconductor material mass; and energizing said mass of semiconductor material into electrical conduction between said positive and negative nodes and through said layer of current dispersing material with a pulse of radiant energy.

17. The method of switching high voltage electrical energy of claim 16 wherein:

said mass of semiconductor material is comprised of intrinsic silicon;

said step of dispersing positive node to negative node electrical current flow in said mass of silicon semiconductor material over a large cross sectional area portion of said mass further includes the steps of launching and collecting said current flow from metallic electrodes disposed at opposed dimensional locations on said silicon semiconductor material mass; and said act of imposing a layer of current dispersing material characterized by one of the current flow mechanisms of quantum mechanics tunneling and space charge limited conduction in said step of dispersing positive node to negative node electrical current flow includes imposing a layer of silicon dioxide material between one of said metallic electrodes and said mass of silicon semiconductor material.

18. The method of switching high voltage electrical energy of claim 17 wherein said step of energizing said mass of semiconductor material into electrical conduction between said positive and negative nodes and through said layer of current dispersing material includes exposing said semiconductor material mass to coherent laser radiant energy having a wavelength between one half and one and one half microns.

19. The method of switching high voltage electrical energy of claim 17 wherein said steps of imposing a layer of silicon dioxide material between one of said metallic electrodes and said mass of silicon semiconductor material includes imposing said layer of silicon dioxide material between a metallic aluminum anode electrode and said silicon semiconductor material.

* * * * *